(12) United States Patent
Bacquet et al.

(10) Patent No.: US 9,541,612 B2
(45) Date of Patent: Jan. 10, 2017

(54) METHOD AND DEVICE FOR MEASURING A MAGNETIC FIELD AND THE TEMPERATURE OF A MAGNETO-RESISTIVE TRANSDUCER

(71) Applicants: Commissariat à l'énergie atomique et aux énergies alternatives, Paris (FR); Renault S.A.S., Boulogne-Billancourt (FR)

(72) Inventors: Sylvain Bacquet, Chasselay (FR); Frédéric Auzas, Paris (FR); Bertrand Delaet, Bernin (FR)

(73) Assignees: Commissariat à l'énergie atomique et aux énergies alternatives, Paris (FR); Renault S.A.S., Boulogne-Billancourt (FR)

( * ) Notice: Subject to any disclaimer, the term of this patent is extended or adjusted under 35 U.S.C. 154(b) by 78 days.

(21) Appl. No.: 14/390,932

(22) PCT Filed: Mar. 29, 2013

(86) PCT No.: PCT/EP2013/056820
§ 371 (c)(1),
(2) Date: Oct. 6, 2014

(87) PCT Pub. No.: WO2013/149967
PCT Pub. Date: Oct. 10, 2013

(65) Prior Publication Data
US 2015/0054500 A1 Feb. 26, 2015

(30) Foreign Application Priority Data

Apr. 6, 2012 (FR) ..................................... 12 53207

(51) Int. Cl.
*G01R 33/09* (2006.01)
*G01R 35/00* (2006.01)
(Continued)

(52) U.S. Cl.
CPC ............. *G01R 33/09* (2013.01); *G01R 15/205* (2013.01); *G01R 33/007* (2013.01); *G01R 35/00* (2013.01); *G01R 35/005* (2013.01)

(58) Field of Classification Search
CPC .................... H01R 43/16; G01R 33/02–33/10; G01R 33/48; G01R 19/0092; G01R 35/005; G01R 35/00; G01R 15/2015
(Continued)

(56) References Cited

U.S. PATENT DOCUMENTS 5,351,003 A 9/1994 Bauer et al.
9,018,946 B2 * 4/2015 Paci ....................... B82Y 25/00
324/228

(Continued)

FOREIGN PATENT DOCUMENTS

WO 2007013724 10/2007

OTHER PUBLICATIONS

Han et al., "A Novel Zero-Drift Detection Method for Highly Sensitive GMR Biochips," IEEE Transactions on Magnetics, IEEE Service Center, New York, NY vol. 42, No. 10, pp. 3560-3562 (2006).

*Primary Examiner* — Melissa Koval
*Assistant Examiner* — Rahul Maini
(74) *Attorney, Agent, or Firm* — Occhiuti & Rohlicek LLP

(57) ABSTRACT

A method for measuring a first magnetic field and the temperature of a magneto-resistive transducer includes producing, by the magneto-resistive transducer, a measurement signal dependent on the intensity of the first magnetic field and on the temperature of the magneto-resistive transducer. The method includes establishing a measurement of the intensity of the first magnetic field on the basis of the measurement signal produced and a measurement of the
(Continued)

temperature of the magneto-resistive transducer. The method also includes generating a second magnetic field to combine with the first magnetic field to form a resultant magnetic field. The method further includes extracting from the measurement signal, the component which is dependent solely on the second magnetic field and establishing the temperature of the magneto-resistive transducer on the basis of the component extracted.

11 Claims, 2 Drawing Sheets

(51) Int. Cl.
   *G01R 33/00* (2006.01)
   *G01R 15/20* (2006.01)
(58) Field of Classification Search
   USPC .................................. 324/224–226; 374/152
   See application file for complete search history.

(56) References Cited

U.S. PATENT DOCUMENTS

| | | | |
|---|---|---|---|
| 2005/0077890 A1 | 4/2005 | Rannow et al. | |
| 2010/0231213 A1* | 9/2010 | Nieuwenhuis | ......... B82Y 25/00 |
| | | | 324/252 |

* cited by examiner

METHOD AND DEVICE FOR MEASURING A MAGNETIC FIELD AND THE TEMPERATURE OF A MAGNETO-RESISTIVE TRANSDUCER

RELATED APPLICATIONS

This application is a U.S. National Stage of international application number PCT/EP2013/056820 filed Mar. 29, 2013, which claims the benefit of the priority date of French Patent Application FR 1253207, filed Apr. 6, 2012, the contents of which are herein incorporated by reference.

FIELD OF INVENTION

The invention relates to a method and a device for measuring a first magnetic field and the temperature of a magneto-resistive transducer, the intensity of the first magnetic field being unknown. The subject of the invention is also a current sensor incorporating this measurement device and an information recording medium for the implementation of the method hereinabove.

BACKGROUND

Known methods for measuring a first magnetic field and the temperature of a magneto-resistive transducer comprise:
the production, by the magneto-resistive transducer, of a measurement signal dependent on the intensity of the first magnetic field, this measurement signal also being dependent on the temperature of the magneto-resistive transducer,
the establishment of a measurement of the intensity of the first magnetic field on the basis of the measurement signal produced, and
the establishment of a measurement of the temperature of the magneto-resistive transducer.

The measurement of the temperature of the magneto-resistive transducer is for example useful for temperature-compensating the measurement of the first magnetic field or the measurement of the current which generates this first magnetic field. It has been proposed in application US 2005/0077890 to use the same magneto-resistive transducer to measure both the first magnetic field and the temperature. In this document, the first magnetic field is generated by a current $I_m$ to be measured flowing in an electrical conductor placed in proximity to the magneto-resistive transducer. When the temperature of the magneto-resistive transducer has to be measured, the current $I_m$ is interrupted and then replaced with a current $I_c$ whose characteristics are known. The measurement signal generated by the magneto-resistive transducer varies, for a given current $I_c$ as a function of the temperature. Thus, by fixing the current $I_c$ it is possible to measure the temperature with the aid of this magneto-resistive transducer.

This method is particularly advantageous since the same magneto-resistive transducer is used to measure the temperature and the first magnetic field.

However, measurement of the temperature makes it necessary to interrupt the current $I_m$. But, when the current sensor described in US 2005/0077890 is used, for example, to measure the current in a phase of an electric motor, it is not possible to interrupt the current $I_m$.

Prior art is also known from:
US2010/231213A1, and
HAN et Al: "Novel zero-drift detection method for highly sensitive GMR biochips", IEEE Transactions on magnetics, IEEE Service center, New York, US, vol. 42, No. 10, 1 Oct. 2006.

SUMMARY OF INVENTION

The invention is therefore aimed at proposing a method for measuring the first magnetic field and the temperature of the magneto-resistive transducer in which it is not necessary to interrupt the first magnetic field in order to carry out the measurement of the temperature. Its subject is therefore a method in accordance with claim 1.

The method hereinabove makes it possible to measure the temperature of the magneto-resistive transducer even in the presence of the first unknown magnetic field. It is therefore not necessary to interrupt this first magnetic field or to know its characteristics in order to carry out the measurement of the temperature.

The embodiments of this method can comprise one or more of the characteristics of the dependent claims.

The embodiments of the method hereinabove furthermore exhibit the following advantages:
  compensating the measurement of the intensity of a temperature-dependent physical quantity as a function of the temperature measured with the aid of the magneto-resistive transducer makes it possible to increase the precision of the measurement of this physical quantity;
  using the temperature measured at the same instant as the first magnetic field makes it possible to increase the precision and the robustness of the measurement of the first magnetic field.

The subject of the invention is also an information recording medium comprising instructions for the execution of the hereinabove method of measurement, when these instructions are executed by an electronic computer.

The subject of the invention is also a measurement device for measuring a first magnetic field and the temperature of a magneto-resistive transducer in accordance with claim 5.

The embodiments of this measurement device can comprise one or more of the characteristics of the dependent claims.

The subject of the invention is also a current sensor in accordance with claim 9.

The embodiments of this current sensor can comprise one or more of the characteristics of the dependent claims.

These embodiments of the current sensor furthermore exhibit the following advantages:
  using a conducting line independent of the electrical conductor makes it possible to optimize the section of the electrical conductor independently of the transverse section of the conducting line and therefore, for example, to measure currents of large intensity, that is to say whose intensity is greater than 10 amperes or 100 amperes;
  using one and the same current line to form both the electrical conductor and the conducting line makes it possible to simplify the production of the current sensor.

The invention will be better understood on reading the description which follows, given solely by way of nonlimiting example, and while referring to the drawings.

BRIEF DESCRIPTION OF THE DRAWINGS

In these figures, the same references are used to designate the same elements.

DETAILED DESCRIPTION

Hereinafter in this description, the characteristics and functions that are well known to the person skilled in the art are not described in detail.

Figure 1:
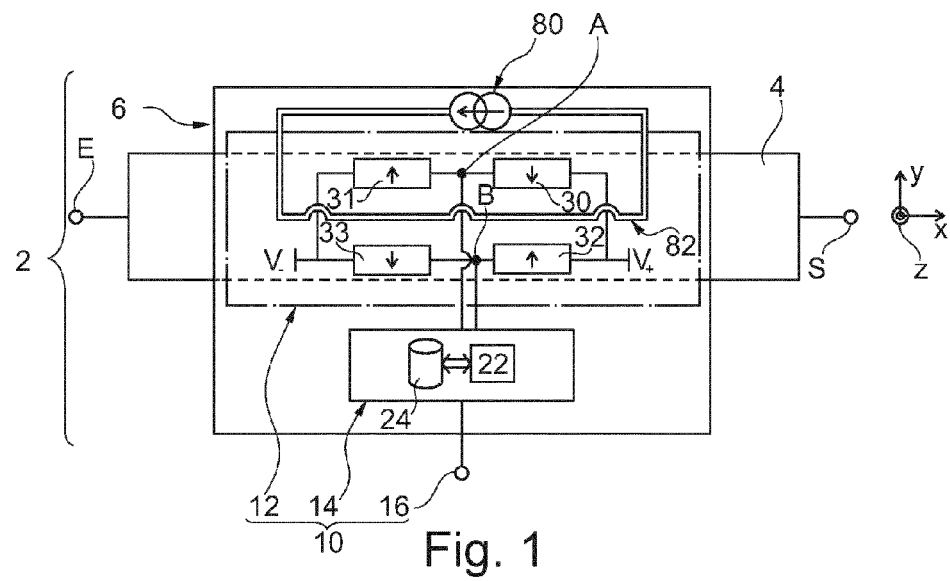
FIG. 1 is a schematic illustration of a current sensor.

FIG. 1 represents a current sensor 2. The current measured can be a direct or alternating current. In the case of an alternating current, its frequency will typically be less than 100 MHz, 0.1 GHz or 0.5 GHz. This sensor 2 comprises an electrical conductor 4. The conductor 4 is rectilinear and parallel to a horizontal direction X of an orthogonal frame X, Y, Z. In the frame X, Y, Z, the direction Y is also horizontal and the direction Z is vertical. The opposite ends of the conductor 4 are connected, respectively, to terminals E and S for input and output of the current $I_m$ to be measured.

An electrically insulating support 6 is fixed, without any degree of freedom, on the conductor 4. Subsequently, a material is considered to be insulating if its resistivity is greater than 1 Ω.m and, preferably, greater than $10^4$ Ω.m at 25° C.

The sensor 2 also comprises a magnetic field measurement device 10 fixed without any degree of freedom on this support 6. This device 10 measures in particular a magnetic field $H_m$ generated by the current $I_m$ flowing in the conductor 4. The field $H_m$ is perpendicular to the direction X. For this purpose, the device 10 comprises:

- a magneto-resistive transducer 12 which transforms the magnetic field in which it is immersed into an electrical measurement signal V, and
- an electronic unit 14 for processing the measurement signal.

Here, the signal V is a voltage. The signal V follows the temporal evolution of the measured field. Thus, when the measured field is alternating, the signal V is an alternating voltage of the same frequency. At each instant, the amplitude of the signal V is representative of the amplitude of the measured field. This unit 14 is able to establish the measurement of the intensity of the field $H_m$ along the direction of measurement Y on the basis of the signal V generated by the transducer 12. This unit 14 is also able to establish the intensity of the current $I_m$ on the basis of the measured intensity of the field $H_m$. The unit 14 delivers the established intensity of the current $I_m$ on an output 16.

For example, the unit 14 is produced on the basis of a programmable electronic computer 22 able to execute instructions recorded on an information recording medium. For this purpose, the unit 14 comprises a memory 24 connected to the computer 22. This memory 24 stores the instructions necessary for executing the method of FIG. 6.

The transducer 12 comprises four magneto-resistive bars 30 to 33 connected together electrically to form a Wheatstone bridge. A magneto-resistive bar is a component whose resistivity varies as a function of the magnetic field in which it is placed. The magneto-resistive bars involved here are spin valves.

This Wheatstone bridge comprises a first branch and a second branch connected electrically in parallel between reference potentials V+ and V−. The potential V− is for example the ground or the earth. The first branch successively comprises, going from the potential V+ to the potential V−, the magneto-resistive bars 30 and 31 connected in series by way of a midpoint A. The second branch successively comprises, going from the potential V+ to the potential V−, the bars 32 and 33 connected in series by way of a midpoint B.

The potentials $V_A$ and $V_B$ at the level of the midpoints A and B are given by the following relations:

$$V_A = (V_+ - V_-)R_2/(R_1+R_2)$$

$$V_B = (V_+ - V_-)R_4/(R_3+R_4)$$

where $R_1$, $R_2$, $R_3$ and $R_4$ designate the resistances, respectively, of the bars 30 to 33.

Here, each bar 30 to 33 has essentially a right-angled parallelepiped shape, at least two large faces of which extend horizontally. The direction in which the bar mainly extends is called the longitudinal direction. Here, this direction is horizontal and parallel to the direction X. The transverse direction is parallel to the direction Y.

Preferably, each bar exhibits a significant aspect ratio, that is to say an aspect ratio of greater than twenty and, preferably, greater than forty or a hundred. This aspect ratio is defined by the ratio of the length L of the bar to its transverse width W.

For example, the length L is greater than 50 or 100 μm and, preferably, less than 1 mm. The transverse width W is typically greater than 0.3 μm or 1 μm and, preferably, less than 15 μm or 30 μm.

Here, the bars 30 to 33 are all disposed above the conductor 4.

The bars 31 and 32 are arranged so that their respective resistances vary in the same sense in response to the same variation of the current $I_m$ to be measured. Here, the bars 31 and 32 are identical.

In this embodiment, the bars 30 and 33 are identical to the bars 31 and 32 except that the direction of magnetization of their respective reference layers is opposite to those of the bars 31 and 32. In FIG. 1, the direction of magnetization of each bar is represented by an arrow. The resistance of the bars 31 and 32 therefore varies in the opposite sense to that of the bars 30 and 33.

The processing unit 14 receives the difference between the potentials $V_A$ and $V_B$ so as to establish the intensity of the current $I_m$ flowing in the conductor 4. This difference between the potentials $V_A$ and $V_B$ constitutes the measurement signal V.

Figure 2:
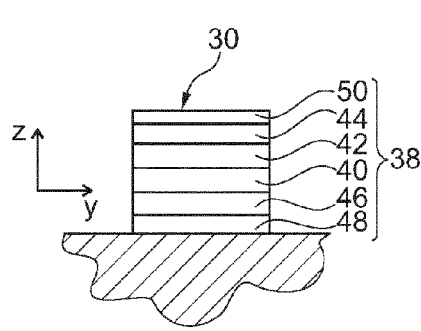
FIG. 2 is a vertical sectional schematic illustration of the transverse section of a magneto-resistive bar used in the sensor of FIG. 1.

The structures of the various magneto-resistive bars are identical and only the structure of the bar 30 is described in greater detail with references to FIG. 2.

The bar 30 comprises a stack 38, immediately consecutive, of a reference layer 40, of a spacer 42 and of a free layer 44 in the vertical direction. Such a stack for obtaining a Giant Magneto Resistor or GMR is conventional. GMRs are also known by the term "spin valves". This stack will not therefore be described in detail.

The reference layer 40 has a magnetization of fixed direction, perpendicular to the direction X. By "fixed direction" is meant here the fact that the direction of magnetization of this layer is much more difficult to modify than the direction of magnetization of the free layer.

For example, the layer 40 is a ferromagnetic layer. It can be made of cobalt, nickel or iron or from their alloys such as CoFe, NiFe, CoFeB or the like.

The direction of magnetization of the layer 40 is fixed with the aid of an anti-ferromagnetic layer 46. The layer 46 serves to trap the direction of magnetization of the layer 40. For example, the layer 46 is made of a manganese alloy such as one of the following alloys IrMn, PtMn, FeMn, NiMn or the like.

The spacer 42 is a layer made of nonmagnetic material. This spacer 42 is thick enough to magnetically decouple the layers 40 and 44. Here, the spacer 42 is a layer of conducting material such as copper.

The free layer 44 exhibits a direction of magnetization which can more easily rotate than that of the reference layer. Here, the direction of easier magnetization of this layer 44 is parallel to the longitudinal direction of the bar, that is to say here the direction X. For example, the layer 44 is a layer made of ferromagnetic material or a stack of ferromagnetic layers.

The stack 38 comprises at each end a conducting electrode, respectively, 48 and 50 to enable the flow of the current which passes through the magneto-resistive bar perpendicularly to the plane of the layers 40, 42 and 44.

To simplify FIG. 2, the thickness ratios between the various layers of the stack 38 have not been complied with in this figure.

Figure 3:
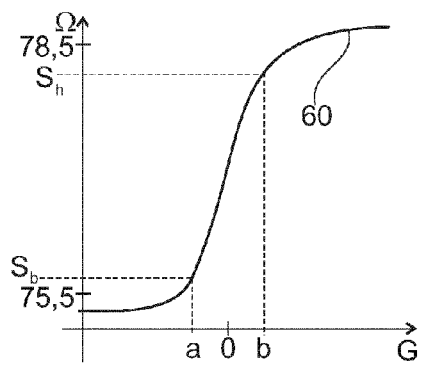
FIG. 3 is a graph illustrating the variation in resistance of the magneto-resistive bar of FIG. 2 in response to a variation of the intensity of a magnetic field.

The variation of the resistance of the magneto-resistive bar 30 as a function of the intensity of a magnetic field inside which it is placed is represented in FIG. 3 by a curve 60. The abscissa axis is graduated in Gauss and the ordinate axis represents the resistance of the bar 30 expressed in Ohms.

In this figure, the curve 60 varies linearly to within plus or minus $x_i\%$ in an interval [a; b] situated around the zero field. Here, the value $x_i$ is chosen less than 20% or 10% and, preferably, less than 5% or 1% or 0.5%. For example, in this embodiment, the value $x_i$ is chosen equal to 1% or 0.25%. Under these conditions, the bounds a and b are substantially equal, respectively, to −20 G and +30 G.

Over the interval [a; b], the resistance of the bar 30 varies linearly between a low threshold $S_b$ and a high threshold $S_h$. The values of the bounds a, b and of the thresholds $S_h$ and $S_b$ are known. For example, they are measured experimentally. Outside of the interval [a; b], the response of the bar 30 varies in a nonlinear manner. By "nonlinear" is meant that if the value of the bound "a" were decreased or if the value of the bound "b" were increased, then the response of the bar 30 would no longer be linear to within $\pm x_i\%$ over this new interval [a; b].

Since the response of the bar 30 is linear in the interval [a; b], the response of the magneto-resistive transducer 12 also varies linearly to within $\pm x_i\%$ in the interval [a; b].

Subsequently, the case is considered where the magneto-resistive transducer 12 works in the interval [a; b].

The resistance of each magneto-resistive bar 30 to 33 also varies as a function of the temperature of this bar. Thus, the signal V generated by the transducer 12 also varies as a function of the temperature of the magneto-resistive bars.

Here, the magneto-resistive transducer 12 is such that, when it is immersed in an arbitrary constant magnetic field lying in the interval [a, b], the measurement signal that it generates varies linearly as a function of temperature over a large interval of temperatures, that is to say over an interval of more than 40° C. or 70° C. wide. For example, the aspect ratio of the magneto-resistive transducer 12 is determined experimentally so that over the interval [a, b], the measurement signal varies linearly both as a function of the magnetic field to be measured and also as a function of temperature. The linearity of the temperature variation over the interval of more than 40° C. is for example less than 20% or 10% or 5% or 1% according to the application envisaged.

Figure 4:
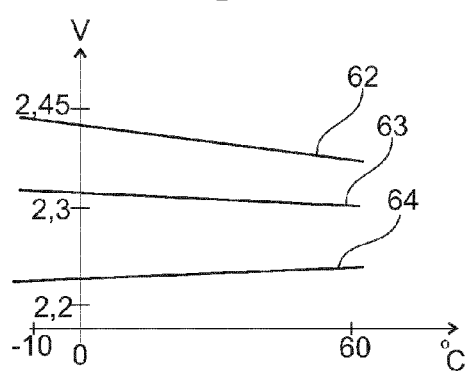
FIG. 4 is a graph illustrating the variation of a measurement signal of the sensor of FIG. 1 as a function of temperature for various constant magnetic fields.

FIG. 4 represents the evolution of the signal V of the transducer 12 as a function of temperature for various constant intensities of the current $I_m$ and in the presence of the terrestrial magnetic field alone. In this graph, the curves 62 to 64 have been obtained for values of the current $I_m$ equal, respectively, to 0 A, 70 A and 120 A. It may be noted that the slope of the curves of the straight lines 62 to 64 varies as a function of the intensity of the constant magnetic field in which the transducer 12 is immersed.

Figure 5:
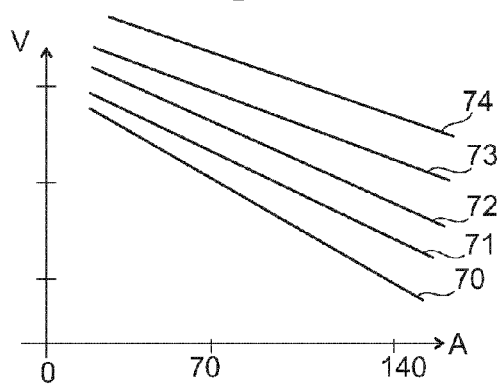
FIG. 5 is a graph illustrating the variation of the measurement signal of the sensor of FIG. 1 in response to a variation of the intensity of the current flowing in a current line for various temperatures.

FIG. 5 represents the evolution of the signal V generated by the transducer 12 as a function of the intensity of the current $I_m$ for various temperatures. In this graph, the straight lines 70 to 74 have been obtained for temperatures equal to, respectively, 0° C., 20° C., 40° C., 80° C. and 120° C.

Just as for the graph of FIG. 4, it may be noted that the slope of the straight lines 70 to 74 varies as a function of temperature.

To be able to measure the temperature of the transducer 12, the device 10 is also equipped with a generator of a second magnetic field $H_c$. In this embodiment, this generator comprises:
 a controllable current source 80, and
 a conducting line 82 whose ends are connected electrically to the current source 80.

This generator is electrically insulated and distinct from the magneto-resistive transducer. The current source 80 generates a current $I_c$ which flows in the line 82. The characteristics of the current $I_c$ are known. These characteristics are the characteristics which make it possible to determine without ambiguity the waveform of the current $I_c$. For example, in this embodiment, the current $I_c$ is a sinusoidal alternating current of frequency $f_c$ and of amplitude $A_c$ where $f_c$ and $A_c$ are known at each instant and controlled by the current source 80.

The source of the current 80 is connected to the processing unit 14. The link which connects these two elements has not been represented so as to simplify FIG. 1. This link allows the unit 14 to know exactly the characteristics of the current $I_c$ presently flowing in the line 82.

The line 82 extends parallel to the conductor 4 so that the magnetic field $H_c$ is generated parallel to the magnetic field $H_m$ to be measured.

The line 82 is positioned in relation to the magneto-resistive bars 30 to 33 in such a way that the field $H_c$ in which each magneto-resistive bar 30 to 33 is immersed is identical. For example, the line 82 passes mid-way between the bars 30 and 32 and between the bars 31 and 33.

The magnetic field, denoted $H_r$, in which the magneto-resistive bars are immersed, results from the combination of the magnetic fields $H_m$ and $H_c$. Thus, during operation, the measurement signal V is essentially the sum of two components $V_c$ and $V_m$. The components $V_c$ and $V_m$ correspond to the voltages corresponding only, respectively, to the currents $I_c$ and $I_m$.

The processing unit 14 is programmed to measure both the temperature $T_m$ of transducer 12 and also the intensity of the field $H_m$ on the basis of the measurement signal V generated by the transducer 12.

Figure 6:
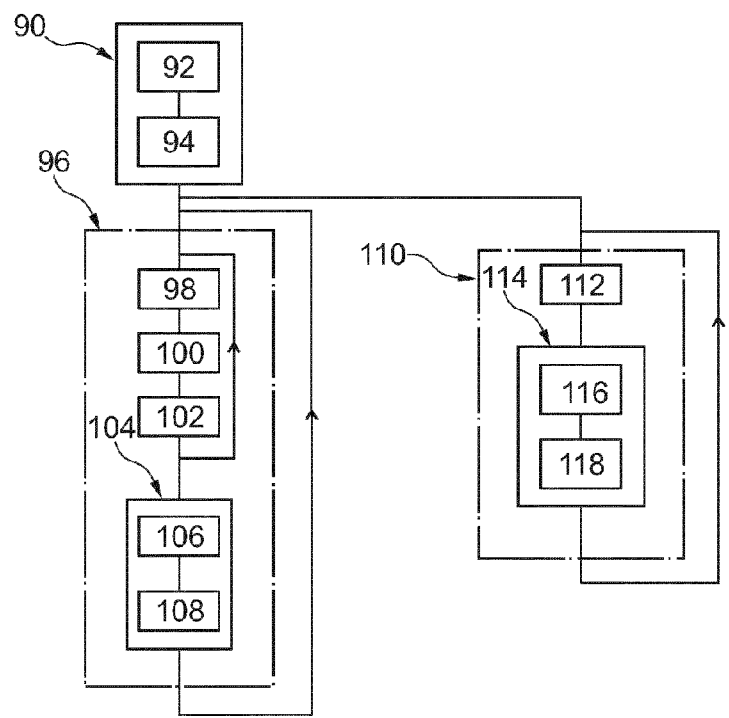
FIG. 6 is a flowchart of a method for measuring a current with the aid of the sensor of FIG. 1.

The manner of operation of the sensor 2 will now be described in greater detail with reference to the method of FIG. 6.

The method starts with a phase 90 of calibrating the sensor 2. This phase comprises a step 92 during which a first calibration table TC1 is recorded in the memory 24. This table TC1 associates with various predetermined values $VT_i$ of the temperature of the transducer 12 a value $\alpha_{ti}$ of the slope of the straight line which relates the value of the component $V_c$ to the amplitude of the current $I_c$.

The phase 90 also comprises a step 94 of recording a second calibration table TC2. This table TC2 associates, with several values $VT_i$ of temperature of the transducer 12, the corresponding coefficients of the equation of the straight line which relates the value of the component $V_m$ to the intensity of the current $I_m$. For each value $VT_i$, the values of these coefficients are denoted $\alpha_{mi}$ and $\beta_{mi}$ respectively.

The values required to construct these calibration tables are for example obtained experimentally.

Once the sensor 2 has been calibrated, the latter is used to measure the unknown current $I_m$ which flows in the conductor 4.

Accordingly, the unit 14 firstly executes a phase 96 of measuring the temperature $T_m$ of the transducer 12 at the same time as the unknown current $I_m$ is flowing in the conductor 4.

This phase 96 starts with a step 98 of generating the field $H_c$. Accordingly, the source 80 causes a known current $I_c$ to flow in the line 82. Here, it is the unit 14 which controls the source 80 so as to impose the amplitude of the current $I_c$. During the first execution of this step 98, the amplitude of the current $I_c$ is denoted $VI_{c1}$. This value $VI_{c1}$ may be zero. Moreover, this value is different from the other values that can be taken by the intensity of the current $I_c$ during the following repetitions of this step 98.

During a step 100, the transducer 12 produces the corresponding measurement signal V. During this step 100, the processing unit 14 acquires the signal V.

During a step 102, the processing unit 14 extracts from the signal V the value $VV_{c1}$ of the component $V_c$. Various procedures are possible for extracting the value $VV_{c1}$ of the component $V_c$ on the basis of the known characteristics of the current $I_c$. For example, here, a synchronous demodulation or synchronous detection is implemented. Accordingly, the signal V is multiplied by a signal temporally synchronized with the current $I_c$. This synchronized signal has for example exactly the same waveform at the same moment as the current $I_c$. Thereafter, a low-pass filter is used to recover the direct component. This direct component makes it possible to obtain the value $VV_{c1}$ of the component $V_c$.

Thereafter, steps 98 to 102 are repeated with a current $I_c$ of the same frequency but whose amplitude is equal to $VI_{c2}$. The value $VI_{c2}$ is different from the value $VI_{c1}$.

During a step 104, the unit 14 establishes the temperature $T_m$ on the basis of the various values $VV_{ci}$ extracted from the signal V during the previous iterations of 20 steps 98 to 102. It is assumed here that steps 98 to 102 have been repeated twice so as to obtain the values $VV_{c1}$ and $VV_{c2}$ of the component $V_c$ respectively for values $VI_{c1}$ and $VI_{c2}$ of the current $I_c$. With the aid of these values $VV_{ci}$, during an operation 106, the unit 14 computes a slope $\alpha_t$. For example, the slope $\alpha_t$ is computed with the aid of the following relation:

$$\alpha_t = (VV_{c2} - VV_{c1})/(VI_{c2} - VI_{c1}).$$

Thereafter, during an operation 108, the unit 14 finds in the table TC1 the temperature $T_m$ of the transducer 12, this temperature being the one associated with the slope $\alpha_t$ computed during the operation 106. Optionally, during this operation 108, the value of the temperature $T_m$ is found by extrapolation, for example linear, if the slope $\alpha_t$ falls between two slopes $\alpha_i$ recorded in the table TC1.

Phase 96 is repeated here in loops so as to measure the temperature $T_m$ continuously.

In parallel, during a phase 110, the intensity of the current $I_m$ is measured.

Accordingly, during a step 112, the unit 14 establishes a measurement of the magnetic field $H_m$. Here, this measurement corresponds to the value of the component $V_m$ of the signal V. This value of the component $V_m$ is for example extracted from the signal V with the aid of the following operation: $V_m = V - V_c$, where $V_c$ is the value of the component $V_c$ extracted at the same moment from the signal V.

Thereafter, during a step 114, the unit 14 temperature-compensates the value of the component $V_m$ thus obtained as a function of the temperature $T_m$ measured at the same instant during the phase 96. It is considered that the temperature $T_m$ is measured at the same instant if this temperature $T_m$ is obtained on the basis of the magnetic field $H_c$ generated by the line 82 at the same time as the magnetic field $H_m$ measured during this phase 110.

Accordingly, during an operation 116, the unit 14 finds in the table TC2 the coefficients $\alpha_{mi}$ and $\beta_{mi}$ of the straight line corresponding to the value of the temperature $T_m$ measured. During this operation 116, optionally, use is made of an extrapolation, for example linear, if the temperature $T_m$ falls between two temperatures of the table TC2. The table TC2 therefore makes it possible to obtain the slope $\alpha_{mi}$ and the constant $\beta_{mi}$ which define the straight line which relates the value of the component $V_m$ to the value of the intensity of the current $I_m$.

During an operation 118, the unit 14 establishes the value of the current $I_m$ corresponding to the component $V_m$ by using the straight line whose slope and constant were found during the operation 116. Thus, the value of the current $I_m$ obtained is temperature-compensated. The use of the straight line selected as a function of the temperature $T_m$ amounts to using a temperature-compensated measurement of the field $H_m$ to establish the measurement of the current $I_m$.

Figure 7:
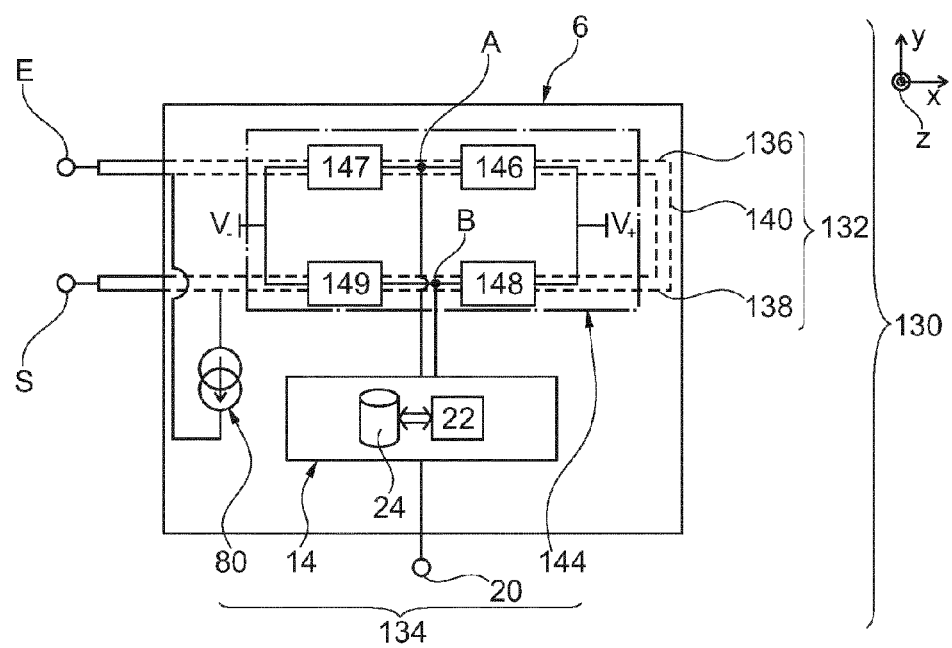
FIG. 7 is a schematic illustration of another embodiment of the current sensor of FIG. 1.

FIG. 7 represents a sensor 130. This sensor 130 is identical to the sensor 2 except that the electrical conductor 4 is replaced with an electrical conductor 132 and the device 10 for measuring the magnetic field is replaced with a device 134 for measuring a magnetic field.

The conductor 132 comprises two strands 136 and 138 which extend parallel to one another in the direction X. These strands 136 and 138 are connected together by an additional strand 140 so that the current $I_m$ measured flows in one direction in the strand 136 and in the opposite direction in the strand 138. Here, these strands 136, 138 and 140 form a "U".

The strands 136 and 138 are also connected, respectively, to terminals E and F for input and output of the current $I_m$.

The device 134 is identical to the device 10 except that the conducting line 82 is omitted and that the magneto-resistive transducer 12 is replaced with a magneto-resistive transducer 144.

In this embodiment, the current source 80 is connected directly, respectively, to the strands 136 and 138. Under these conditions, the current $I_c$ generated by the source 80 is superimposed with the current $I_m$ to be measured in the strands 136 and 138.

The transducer 144 is identical to the transducer 12 except that the magneto-resistive bars 30 to 33 are replaced, respectively, with magneto-resistive bars 146 to 148. These magneto-resistive bars 146 to 148 are all identical. For example, they are identical to the bars 30. However, in the transducer 144, the bars 146 and 148 are arranged in such a way that their resistance does not vary in response to a variation of the intensity of the current in the conductor 132. For example, the transducer 144 comprises a magnetic screen interposed between the bars 146 and 148 and the conductor 132.

Here, the bars 146 and 147 are disposed above the strand 136 so as to be at least two or three times closer to this strand 136 than to the strand 138. Thus, the bars 146 and 147 are essentially sensitive to the magnetic field $H_m$ created by the current which flows in the strand 136.

In a similar manner, the bars 148 and 149 are disposed above the strand 138 so as to be two or three times closer to this strand 138 than to the strand 136. Thus, the bars 148 and 149 are essentially sensitive to the magnetic field created by the current which flows in the strand 138.

In the sensor 130, the same electrical conductor 132 is used to enable the currents $I_c$ and $I_m$ to flow. However, as previously, the measurement signal generated by the transducer 144 is formed by the sum of the components $V_c$ and $V_m$. The method of operation of the sensor 130 is therefore identical to that described with reference to FIG. 6.

Numerous other embodiments are possible. For example, the magneto-resistive transducers can be produced in various ways. For example, the magneto-resistive transducer is produced on the basis of a single magneto-resistive bar. In this case, no Wheatstone bridge is used.

In another embodiment, another configuration of the Wheatstone bridge than that described previously is used. For example, it will be possible to refer in this regard to the various Wheatstone bridges described in application US 2011/0227560.

Other embodiments of the magneto-resistive bars are possible. For example, the magneto-resistive bar is designed to form a magnetic tunnel junction using the tunnel effect better known by the acronym TMR (Tunnel Magneto-Resistance). In a tunnel junction, the spacer is made of insulating nonmagnetic material. For example, it may be an oxide or an aluminum nitride. For example, the spacer is made of alumina $Al_2O_3$, manganese oxide MgO or strontium titanium oxide ($SrTiO_3$) or the like.

It is not necessary for the temperature $T_m$ to be used to compensate a physical quantity measured at the same time. As a variant, the temperature $T_m$ used to compensate the measurement of the current $I_m$ is not necessarily established on the basis of the magnetic field $H_c$ generated at the same time as the field $H_m$. Thus, if the temperature of the magneto-resistive transducer does not vary rapidly, at the instant $t_1$, the temperature of the transducer is established. Thereafter, at a later instant $t_2$, this temperature is used to compensate the measurement of the current $I_m$.

The temperature established on the basis of the magneto-resistive transducer is not necessarily used to temperature-compensate a physical quantity dependent on the field $H_m$. For example, the measured temperature is used only to estimate the temperature of an electric motor or the like.

In another embodiment, the magneto-resistive transducer is used solely to measure the temperature in the presence of an unknown magnetic field without this unknown magnetic field $H_m$ being measured.

The temperature $T_m$ can be used to temperature-compensate physical quantities other than the current $I_m$. For example, as a variant, the field $H_m$ is temperature-compensated before the establishment of the measurement of the current $I_m$. Accordingly, it is possible to proceed in a manner similar to what was described in respect of the temperature compensation of the current $I_m$. In this case, preferably, the temperature-compensated field $H_m$ is used to establish the measurement of the current $I_m$. The temperature compensation may also take place only after the establishment of the current $I_m$, for example during the establishment of a value for a physical quantity dependent on the current $I_m$. Thus, for example, the temperature $T_m$ is used to temperature-compensate an electrical power dependent on the current $I_m$ that is not already temperature-compensated.

Steps 98, 100 and 102 may be repeated more than twice to obtain several values of the component $V_c$. For example, accordingly, the amplitude of the current $I_c$ follows a known ramp.

Other procedures are possible for extracting the value of the component $V_c$ of the signal V. For example, a bandpass filter centered on the frequency $f_c$ of the current $I_c$ can be used.

Other procedures for establishing the temperature on the basis of the values of the component $V_c$ are possible. For example, a calibration table coding a graph similar to that of FIG. 4 is recorded in the unit 14. The recorded table contains, for several different values of the current $I_c$, the equation of the straight line which associates the value of the component $V_c$ with the value of the temperature $T_m$. Thereafter, knowing the value $VI_c$ of the current $I_c$, it is possible to select the straight line to be used with the aid of this calibration table. The straight line selected gives the value of the temperature $T_m$ as a function of the value $VV_c$ of the component $V_c$.

The invention claimed is:

1. A method for measuring a first magnetic field and the temperature of a magneto-resistive transducer, the intensity of the first magnetic field being unknown, the method comprising:

producing, by the magneto-resistive transducer, a measurement signal dependent on the intensity of the first magnetic field, the measurement signal also being dependent on the temperature of the magneto-resistive transducer, establishing a measurement of the intensity of the first magnetic field on the basis of the measurement signal produced, and establishing a measurement of the temperature of the magneto-resistive transducer, the method also comprising:

generating, at the same time as the first magnetic field, a second magnetic field, on the basis of a generator electrically insulated from the magneto-resistive transducer, whose characteristics are known, the second magnetic field being combined with the first magnetic field to form a resultant magnetic field which is measured by the magneto-resistive transducer, extracting from the measurement signal produced, the component of this signal which is dependent solely on the second magnetic field alone, using the known characteristics of the second magnetic field, and establishing the temperature of the magneto-resistive transducer on the basis of the component extracted.

2. The method as claimed in claim 1, in which:

measuring the intensity of the first magnetic field is established on the basis of the measurement signal from which the extracted component has been subtracted, and the method comprises the temperature compensation of a physical quantity dependent on the intensity of the first magnetic field, with the aid of the temperature of the magneto-resistive transducer established on the basis of the component extracted.

3. The method as claimed in claim 2, in which the temperature compensation is carried out as a function of the temperature of the magneto-resistive transducer established with the aid of the second magnetic field generated at the same time as the first magnetic field.

4. A non-transitory information recording medium, containing program instructions to be executed by an electronic computer for measuring a first magnetic field and the temperature of a magneto-resistive transducer, the intensity of the first magnetic field being unknown, comprising:

producing, by the magneto-resistive transducer, a measurement signal dependent on the intensity of the first magnetic field, the measurement signal also being dependent on the temperature of the magneto-resistive transducer, establishing a measurement of the intensity of the first magnetic field on the basis of the measurement signal produced, and establishing a measurement of the temperature of the magneto-resistive transducer, generating, at the same time as the first magnetic field, a second magnetic field, on the basis of a generator electrically insulated from the magneto-resistive transducer, whose characteristics are known, the second magnetic field being combined with the first magnetic field to form a resultant magnetic field which is measured by the magneto-resistive transducer, extracting from the measurement signal produced, the component of this signal which is dependent solely on the second magnetic field alone, using the known characteristics of the second magnetic field, and establishing the temperature of the magneto-resistive transducer on the basis of the component extracted.

5. A device for measuring a first magnetic field and the temperature of a magneto-resistive transducer, the intensity of the first magnetic field being unknown, the magneto-resistive transducer capable of producing a measurement signal dependent on the intensity of the first magnetic field, the measurement signal also being dependent on the temperature of the magneto-resistive transducer, the device comprising:

a processing unit configured to:
establish a measurement of the intensity of the first magnetic field on the basis of the measurement signal produced, and
establish a measurement of the temperature of the magneto-resistive transducer, and a generator electrically insulated from the magneto-resistive transducer, configured to generate, at the same time as the first magnetic field, a second magnetic field whose characteristics are known, their second magnetic field being combined with the first magnetic field to form a resultant magnetic field which is measured by the magneto-resistive transducer, wherein the processing unit is further configured to:

extract, from the measurement signal produced, the component of this signal which is dependent solely on the second magnetic field alone, using the known characteristics of the second magnetic field, and establish the temperature of the magneto-resistive transducer on the basis of the component extracted.

6. The device as claimed in claim 5, in which the processing unit is configured:

to generate the measurement of the intensity of the first magnetic field on the basis of the measurement signal from which the extracted component has been subtracted, and to temperature-compensate a physical quantity dependent on the intensity of the first magnetic field, with the aid of the temperature of the magneto-resistive transducer established on the basis of the component extracted.

7. The device as claimed in claim 5, in which the generator further comprises:

a conducting line generating the second magnetic field when it is traversed by a known current, and a current source connected electrically to the conducting line and able to produce the known current in this conducting line.

8. A current sensor comprising:

an electrical conductor in which the current to be measured flows, a measurement device for measuring the first magnetic field corresponding to the magnetic field generated by the current to be measured flowing in the electrical conductor, the processing unit configured to establish the measurement of the intensity of the current to be measured on the basis of the first magnetic field measured by the measurement device, wherein the measurement device is in accordance with claim 7 and the conducting line of the generator is electrically insulated from the electrical conductor in which the current to be measured flows.

9. The device as claimed in claim 5, in which the magneto-resistive transducer comprises a spin valve or a tunnel magnetoresistor.

10. A current sensor comprising:

an electrical conductor in which the current to be measured flows, a measurement device for measuring a first magnetic field corresponding to the magnetic field generated by the current to be measured flowing in the electrical conductor, a processing unit configured to establish the measurement of the intensity of the current to be measured on the basis of the first magnetic field measured by the measurement device, wherein the measurement device is in accordance with claim 5.

11. A current sensor comprising:

an electrical conductor in which a current to be measured flows, a measurement device for measuring a first magnetic field and the temperature of a magneto-resistive transducer, the magneto-resistive transducer capable of producing a measurement signal dependent on the intensity of the first magnetic field, the measurement signal also being dependent on the temperature of the magneto-resistive transducer, the first magnetic field generated by the current to be measured flowing in the electrical conductor, the intensity of the first magnetic field being unknown, the measurement device comprising:

a processing unit configured to:
  establish a measurement of the intensity of the first magnetic field on the basis of the measurement signal produced, and
  establish a measurement of the temperature of the magneto-resistive transducer, and a generator, electrically insulated from the magneto-resistive transducer, configured to generate, at the same time as the first magnetic field, a second magnetic field whose characteristics are known, the second magnetic field being combined with the first magnetic field to form a resultant magnetic field which is measured by the magneto-resistive transducer, wherein the processing unit is further configured to:
  extract, from the measurement signal produced, the component of this signal which is dependent solely on the second magnetic field alone, using the known characteristics of the second magnetic field,
  establish the temperature of the magneto-resistive transducer on the basis of the component extracted, wherein the generator further includes a conducting line generating the second magnetic field when it is traversed by a known current, and a current source connected electrically to the conducting line and able to produce the known current in this conducting line; and wherein the electrical conductor and the conducting line from just a single current line in which the known current of the current source is superimposed with the current to be measured so as to generate the first and second magnetic fields at the same time.

* * * * *